US008632263B2

(12) United States Patent
Nekado et al.

(10) Patent No.: US 8,632,263 B2
(45) Date of Patent: *Jan. 21, 2014

(54) OPTICAL MODULE MOUNTING UNIT AND OPTICAL MODULE

(71) Applicant: The Furukawa Electric Co., Ltd., Tokyo (JP)

(72) Inventors: Yoshinobu Nekado, Tokyo (JP); Hideyuki Nasu, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/754,961

(22) Filed: Jan. 31, 2013

(65) Prior Publication Data

US 2013/0148931 A1 Jun. 13, 2013

Related U.S. Application Data

(63) Continuation of application No. 12/937,663, filed as application No. PCT/JP2009/057426 on Apr. 13, 2009, now Pat. No. 8,382,384.

(30) Foreign Application Priority Data

Apr. 14, 2008 (JP) ................................ 2008-104772

(51) Int. Cl.
*G02B 6/36* (2006.01)

(52) U.S. Cl.
USPC .................. 385/92; 385/14; 385/89; 439/331

(58) Field of Classification Search
USPC .......................................... 385/14, 88, 89, 92
See application file for complete search history.

(56) References Cited

U.S. PATENT DOCUMENTS 5,061,033 A * 10/1991 Richard ........................ 385/92

(Continued)

FOREIGN PATENT DOCUMENTS

| JP | 2006 39255 | 2/2006 |
| JP | 2006 73781 | 3/2006 |
| JP | 2009 53281 | 3/2009 |

OTHER PUBLICATIONS

The Extended European Search Report issued Jul. 27, 2012, in European Patent Application No. 09733514.5.
International Search Report issued May 19, 2009 in PCT/JP09/57426 filed Apr. 13, 2009.

(Continued)

*Primary Examiner* — Hemang Sanghavi
(74) *Attorney, Agent, or Firm* — Oblon, Spivak, McClelland, Maier & Neustadt, L.L.P.

(57) ABSTRACT

An optical module includes a module housing body including an electrical connection section for electrically connecting the electronic substrate and the optical module to each other and a housing section for housing the optical module, where the module housing body is mounted on the electronic substrate in such a manner that an electrical connection terminal of the electronic substrate and the electrical connection section is connected to each other and a fixing member for maintaining a state in which an electrical connection terminal of the optical module has contact with the electrical connection section in the module housing body. The optical module is housed in the housing section and is fixed in a removable manner by the fixing member, and the optical waveguide and the optical element are configured to be optically coupled to each other in a state in which the optical module is fixed.

7 Claims, 8 Drawing Sheets

(56) References Cited

U.S. PATENT DOCUMENTS

| | | |
|---|---|---|
| 7,329,054 B1 | 2/2008 | Epitaux et al. |
| 7,344,383 B1 | 3/2008 | Lu et al. |
| 7,559,702 B2 * | 7/2009 | Fujiwara et al. ............ 385/88 |
| 8,047,856 B2 | 11/2011 | McColloch |
| 2002/0115316 A1 | 8/2002 | Bright |
| 2006/0269296 A1 | 11/2006 | Hayase et al. |
| 2007/0123089 A1 | 5/2007 | Nishio et al. |

OTHER PUBLICATIONS

SNAP12 12 channel pluggable optical module MSA, Specifications, Appendix to SNAP12 Multi-Source Agreement, Revision 1.1, pp. 1-21, (May 15, 2002).

Chinese Office Action issued Jan. 31, 2012, in Patent Application No. 200980112726.1 (with English-language translation).

Office Action issued May 13, 2013, in Canadian Patent Application No. 2,725,286.

* cited by examiner

OPTICAL MODULE MOUNTING UNIT AND OPTICAL MODULE

CROSS-REFERENCE TO RELATED APPLICATIONS

This application is a continuation of and is based upon and claims the benefit of priority under 35 U.S.C. §120 for U.S. Ser. No. 12/937,663, filed Oct. 13, 2010 the entire contents of which is incorporated herein by reference. U.S. Ser. No. 12/937,663 is the national stage of PCT/JP2009/057426, filed Apr. 13, 2009 and claims the benefit of priority under 35 U.S.C. §119 from Japanese Patent Application No. 2008-104772, filed Apr. 14, 2008.

TECHNICAL FIELD

The present invention relates to an optical module mounting unit and an optical module, and more particularly, to a technique useful in mounting an optical module on an electronic substrate.

BACKGROUND ART

In recent years, a high-end system apparatus such as a supercomputer tends to achieve development of large-capacity and high-speed information communication by parallel operation of a plurality of CPUs, and large-capacity, high-speed, and high-density signal transmission between boards in the system apparatus and between apparatuses are required.

Since an electronic transmission system is approaching a limit in view of a transmission speed, transmission loss, and the like, a signal transmission by an optical interconnection system using an optical transmission is put into practical use. The optical interconnection system can perform far wider-band signal transmission compared to the electronic transmission system, and has an advantage in building up a signal transmission system using a compact optical module with low power consumption.

In the optical interconnection system, an optical module equipped with a light emitting element is mounted on an electronic substrate, and an electrical signal input from the electronic substrate is converted into an optical signal by the optical module to be output to an optical waveguide such as an optical fiber, for example.

A vertical cavity surface emitting laser (VCSEL) and the like are typically used as the light emitting element for the optical module.

Such an optical module is generally bonded to the electronic substrate by soldering or conductive adhesive connection.

For example, a technique described in Non-Patent Document 1 is proposed as a technique for mounting the optical module on the electronic substrate. The technique described in Non-Patent Document 1 provides high-density connectors called a MEG-Array (registered trademark) in both an optical module and an electronic substrate, and makes the connectors engage with each other to mount the optical module. In this case, the optical module and one connector, and the other connector and the electronic substrate are respectively adhered to each other by soldering.

PRIOR ART DOCUMENT

Non-Patent Document

Non Patent Document 1: SNAP12 MSA Revision 1.1 May 15, 2002 (http://www.physik.unizh.ch/~avollhar/snap12msa_051502.pdf)

SUMMARY OF THE INVENTION

Problems to Be Solved by the Invention

Since the optical module is conventionally mounted on the electronic substrate by bonding, as described above, the optical module is not removable from the electronic substrate. Thus, since the mounting of the optical module is premised on non-interchanging, the optical module and the electronic substrate on which the optical module is mounted are required to guarantee long-term reliability.

However, if very high reliability is required for the optical module, a yield ratio in manufacturing the optical modules decreases remarkably, and cost reduction becomes difficult.

In case of achieving high-speed and high-density signal transmission as optical interconnection, a plurality of optical modules are mounted with a high density around a CPU on the same electronic substrate. If bonding defect or failure occurs in the optical module, the whole electronic substrate on which the optical modules are mounted needs to be replaced.

Also in the case where a specification of the electronic substrate is changed or in the case where an upgrade of the optical module is needed, the whole electronic substrate on which the optical modules are mounted needs to be replaced.

Thus, since the conventional technique for mounting the optical module cannot effectively utilize module properties such as normal optical modules and electronic substrates, it causes a considerable loss.

When using the technique described in Non-Patent Document 1, since the optical module is removable from the electronic substrate, a demand for high reliability is less stringent than in the prior art. However, since the connector is fixed to the optical module by soldering, the optical module is possibly affected by heat in soldering process. For this reason, when trying to guarantee the reliability of the optical module after soldering process, a yield ratio of production thereof is still low, and cost reduction becomes difficult.

Moreover, since the technique described in Non-Patent Document 1 mounts the optical module on the electronic substrate by making MEG-Array connectors engage with each other, it is difficult to shorten line lengths in connecting portions (for example, a length of a pin of a connector is about 3 millimeters, and becomes about 4 millimeters including a BGA solder ball for mounting), and it might become a factor of degrading the characteristics such as transmission loss and crosstalk. Furthermore, since the technique needs the connector portions having predetermined heights, it is disadvantageous in downscaling the optical module.

An object of the present invention is to provide a technique useful for mounting an optical module on an electronic substrate for coping with a defect of the optical module flexibly, and especially useful in optical interconnection realizing high-speed and high-density signal transmission.

Means for Solving the Problems

The present invention is made to achieve the above object, and there is provided an optical module mounting unit for mounting an optical module including an optical element to be optically coupled to an optical waveguide on an electronic substrate. The optical module mounting unit includes a module housing body including an electrical connection section for electrically connecting the electronic substrate and the optical module to each other and a housing section for housing the optical module, where the module housing body is mounted on the electronic substrate so that an electrical connection terminal of the electronic substrate and the electrical connection section is connected to each other and a fixing member for maintaining a state in which an electrical connection terminal of the optical module contacts with the electrical connection section in the module housing body. The optical module is housed in the housing section and is fixed in a removable manner by the fixing member. The optical waveguide and the optical element are configured to be optically coupled to each other in a state in which the optical module is fixed.

Preferably, the module housing body is mounted on the electronic substrate in a removable manner.

Preferably, the module housing body is formed in a box-shape with a top opening. The housing section is a space formed by a bottom wall and a side wall. The electrical connection section electrically connects the electrical connection terminal of the electronic substrate, which is arranged on a bottom surface of the bottom wall, to the electrical connection terminal of the optical module, which is arranged on an upper surface of the bottom wall, through the bottom wall.

Preferably, the housing section includes a guiding portion for guiding the optical module to a housing position.

Preferably, the fixing member is a lid-like pressing member to be mounted on an upper surface of the module housing body. The pressing member presses a top surface of the optical module to an electronic substrate side.

Preferably, the pressing member includes an aperture as a part of the pressing member.

Preferably, the pressing member is configured to install an optical connector in the optical module through the pressing member. The optical connector is equipped with an optical waveguide and configured to convert an optical path perpendicularly. The pressing member is formed in such a manner that an upper surface of the pressing member and an upper surface of the optical connector are substantially on the same level when the optical connector is installed in the optical module.

Preferably, the pressing member is composed of material having a thermal conductivity equal to or higher than that of a housing member of the optical module.

Preferably, the pressing member includes a planar portion on which a heat radiating member can be placed.

Preferably, the electrical connection section is composed of a plurality of first contact sections and a plurality of second contact sections which are electrically connected to each other. The first contact sections project from the upper surface of the bottom wall to contact with the electrical connection terminal of the optical module. The second contact sections are provided corresponding to the first contact sections and projecting from the bottom surface of the bottom wall to contact with the electrical connection terminal of the electronic substrate. The electrical connection section includes an urging member for urging the optical module and the module housing body in a direction of separating the optical module and the module housing body from the electronic substrate when the optical module is pressed to the electronic substrate side by the fixing member. The urging member is respectively provided between the first contact sections and the second contact sections.

Preferably, the first contact sections and the second contact sections are arranged in such a manner that a pressing force is dispersed uniformly when the optical module is pressed to the electronic substrate side by the pressing member.

Preferably, a plurality of the optical modules are configured to be installed in the optical module mounting unit.

Preferably, the optical module is installed in the optical module mounting unit.

Advantageous Effects of the Invention

According to the present invention, because an optical module is mounted on an electronic substrate in a removable manner, module properties can effectively be utilized. Moreover, since it becomes unnecessary to guarantee an excessive reliability of the optical module and a certain reliability of the optical module can be secured without harmful influences exerted by soldering, a yield ratio is improved, and costs thereof can be reduced.

BEST MODE FOR CARRYING OUT THE INVENTION

Exemplary embodiments of the present invention are described in detail below with reference to accompanying drawings.

The present embodiment explains about the case of mounting an optical module on an electronic substrate by using an optical module mounting unit according to the present invention when achieving an optical interconnection between electronic substrates (boards) of a system apparatus such as a computer. In this case, since it is desirable that a space in a vertical direction with respect to the electronic substrate is small for the miniaturization of the system apparatus, an optical waveguide which is optically interconnected to the optical module is arranged parallel to the electronic substrate.

Figure 1:
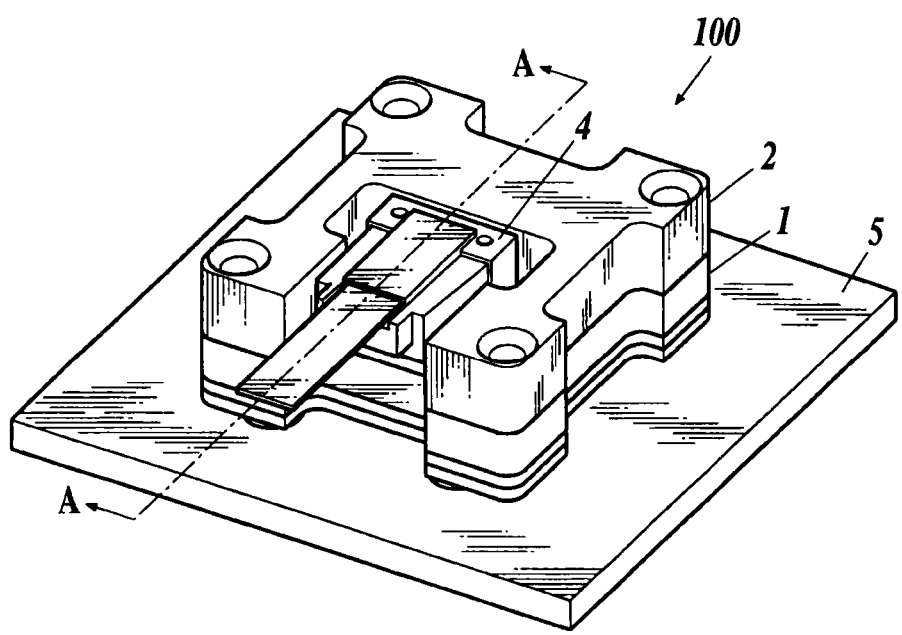
FIG. 1 is a perspective view of a mounted state of an optical module according to the present embodiment.
Figure 2:
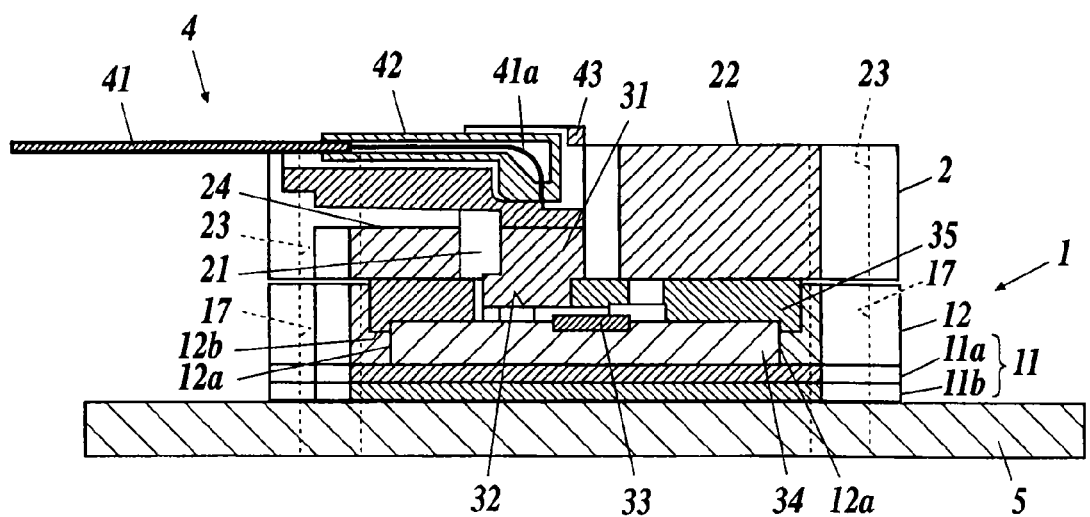
FIG. 2 is a cross section taken along a line A-A in FIG. 1.
Figure 3:
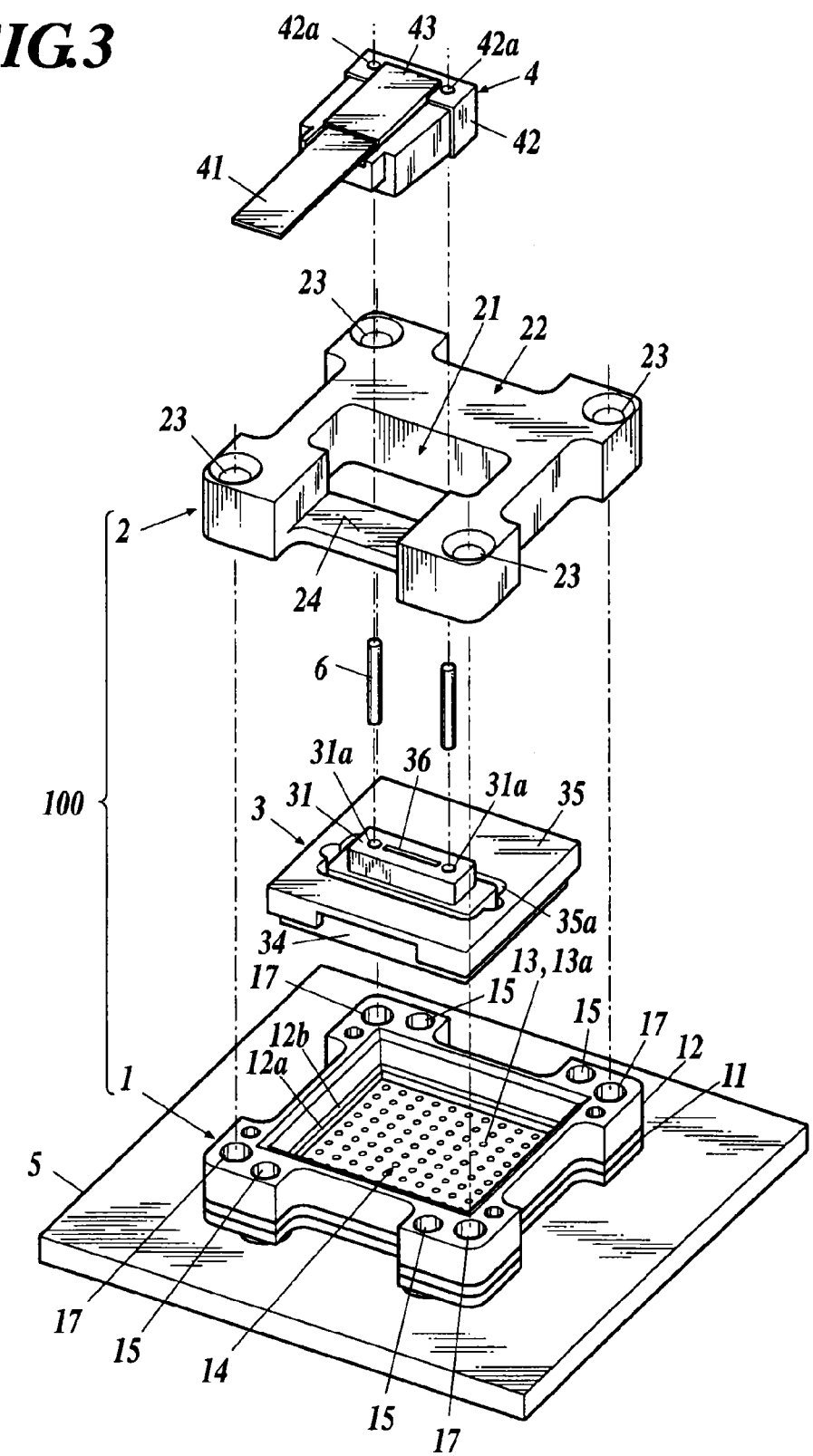
FIG. 3 is an exploded perspective view of FIG. 1.
Figure 4:
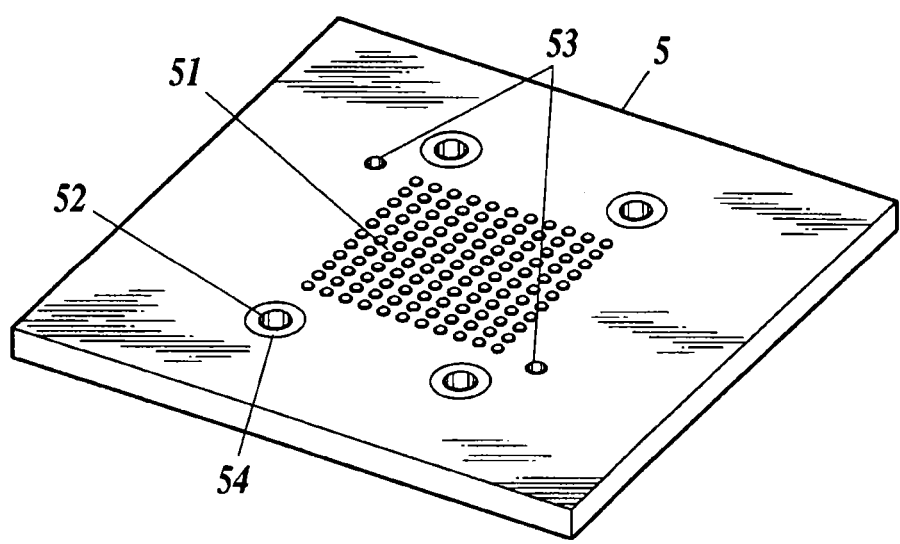
FIG. 4 is a perspective view of an electronic substrate 5.

FIG. 1 is a perspective view of a mounted state of an optical module according to the present embodiment, FIG. 2 is a cross section taken along a line A-A in FIG. 1, and FIG. 3 is an exploded perspective view of FIG. 1. FIG. 4 is a perspective view of an electronic substrate 5.

As shown in FIGS. 1 to 3, an optical module mounting unit 100 according to the present embodiment includes a socket 1 and a pressing member 2, and an optical module 3 is housed therein (in a housing section 14 of the socket 1).

By mounting the optical module mounting unit 100 housing the optical module 3 therein to the electronic substrate 5, the optical module 3 is mounted on the electronic substrate 5.

By fixing an optical connector 4 to guide pins 6 provided to stand on the optical module 3, a light emitting element 32 of the optical module 3 and an optical fiber ribbon 41 of the optical connector 4 become possible to be optically coupled to each other.

The optical module mounting unit 100 has a function to mount the optical module 3 on the electronic substrate 5 and a function as a receptacle to install the optical connector 4 in the optical module 3.

Hereinafter, the case where the optical module 3 emits a light to the optical connector 4 based on an electrical signal input from the electronic substrate 5, namely the case where the optical module 3 is equipped with a light emitting element is described. In addition, even if the optical module 3 is equipped with a light receiving element, a mounted state of the optical module 3 is similar to that of the present embodiment.

The optical module 3 is configured by surface-mounting the light emitting element 32 and a driver IC 33 driving the light emitting element 32 on a module substrate 34 and by covering them with a case cover 35 for protection. The optical module 3 has a characteristic of performing high speed multichannel signal transmission of 10 Gbps×12 ch, for example.

On the back surface of the module substrate 34, an electrical connection terminals (not shown) are provided so as to be opposed to an electrical connection section 13 (first contact pins 13a), which will be described later, of the socket 1. The electrical connection terminals are formed as a land grid array (LGA) in which fine lead electrodes are arranged in a lattice, for example.

The light emitting element 32 is composed of a plurality of (for example, twelve) VCSELs arranged in an array, for example, and the respective VCSELs are electrically connected to the driver IC 33 with a predetermined wiring pattern.

When electrical signals are input to the driver IC 33 through the electrical connection terminals, the driver IC 33 outputs a drive signal (electrical signal), the light emitting element 32 emits a light based on the drive signal. At this time, the emitting direction of the light is a vertical direction with respect to the electronic substrate 5.

On the light emitting side (upper side in the drawing) of the light emitting element 32, a ferrule 31 through which an optical waveguide (optical fiber) 36 opposed to the light emitting element 32 is inserted is provided, and a light emitting facet of the light emitting element 32 and the optical waveguide 36 are optically coupled by being butted against each other, namely by butt-jointing.

An aperture section 35a is formed in a region of the case cover 35 corresponding to the ferrule 31, and a light output end of the ferrule 31 is exposed to an outside through the aperture section 35a. In the light output end of the ferrule 31, guide pin holes 31a, 31a for providing the guide pins 6 to stand are formed.

The electronic substrate 5 has characteristics of high-speed transmission and good crosstalk performance, which are necessary for operating the optical module 3. On the back surface of the electronic substrate 5, a predetermined wiring pattern (not shown) is formed, and on the top surface of the electronic substrate 5, electrical connection terminals 51 which are electrically connected to the wiring pattern is formed (see FIG. 4). The electrical connection terminals 51 is composed as an LGA, in which fine lead electrodes are arranged in a lattice, for example. FIG. 4 shows the case where the electrical connection terminals 51 are formed to be a full grid pattern of 11×11 on the electronic substrate 5. In this regard, however, all of the electrical connection terminals 51 are not connected to the wiring pattern.

In the vicinity of each of four corners of the electrical connection terminals 51, through-holes 52 for inserting screws for fixing the socket 1 are formed. In the vicinity of each of diagonally opposed two corners of the electrical connection terminals 51, locating pin holes 53 for adjusting a mounting position of the socket 1 are formed.

In the peripheries of respective through-holes 52, metal land patterns 54 of the electronic substrate 5 are formed, and surfaces of the metal land patterns 54 are on the same level of surfaces of land patterns of the electrical connection terminals 51. By this configuration, lengths of the contact pins of the socket 1 to be described later can be shorten, and thereby inductance can be reduced. This is preferable for high frequency operation characteristics.

The optical connector 4 is configured in such a manner that the optical fiber ribbon 41 is mounted on a ferrule 42 in the state of being housed in an optical waveguide mounting part 43. The optical waveguide mounting part 43 is fixed to the ferrule 42 with an adhesive, for example.

As shown in FIG. 2, the present embodiment uses a 90-degrees-bent fiber having a bending portion 41a, as the optical fiber ribbon 41. It is also possible to adopt the structure of converting an optical path of a light emitted from the optical module 3 in a vertical direction using a reflection mirror in place of the 90-degrees-bent fiber to guide the light to the optical fiber ribbon 41 arranged parallel to the electronic substrate 5.

The optical fiber ribbon 41 is made by arranging twelve optical waveguides (optical fibers) parallel to one another and by covering the optical waveguides with a covering material to form one optical fiber ribbon, for example. On one end side (the side on which the optical fiber ribbon 41 is installed in the optical module 3) of the optical fiber ribbon 41, the covering material of tip portion is removed, and the optical waveguides are exposed.

Since the optical fiber ribbon 41 is housed in the optical waveguide mounting part 43, the optical fiber ribbon 41 is protected and the bent angle (90 degrees) of the optical fiber ribbon 41 is maintained.

Guide pin holes 42a, 42a for inserting the guide pins 6 are formed in the ferrule 42. By respectively inserting the guide pins 6, 6 provided to stand on the ferrule 31 of the optical module 3 into the guide pin holes 42a, 42a of the ferrule 42, the optical module 3 and the optical connector 4 are fixed to each other in the state in which their positions are aligned.

The socket 1 is composed of a bottom wall 11 and a rectangular frame-like side wall 12 which is provided to be placed on a periphery of the bottom wall 11, and an overall shape of the socket 1 is like a box having an opened upper surface. A space formed of the bottom wall 11 and the side wall 12 becomes the housing section 14 for housing the optical module 3.

The bottom wall 11 has a space for arranging the electrical connection section 13 therein. In the present embodiment, an upper plate 11a and a lower plate 11b are joined to each other by laminating to constitute the bottom wall 11 so that the electrical connection section 13 is easily arranged. The space is communicatively connected to the outside, and one end of the electrical connection section 13 arranged in the space projects upward from the upper plate 11a, and the other end of the electrical connection section 13 projects downward from the lower plate 11b.

The side wall 12 and the upper plate 11a may be formed integrally. In other words, the socket 1 may have a configuration where the side wall 12 having a box-like shape is placed on the lower plate 11b.

The electrical connection section 13 has characteristics of high-speed transmission and good crosstalk performance, which are necessary for operating the optical module 3, similarly to the electronic substrate 5. The electrical connection section 13 electrically connects the respective electrical connection terminals 51 of the electronic substrate 5 which are arranged on the bottom surface of the lower plate 11b, and respective electrical connection terminals (not shown) of the optical module 3 which are arranged on the upper surface of the upper plate 11a, to each other.

To put it concretely, the electrical connection section 13 has a configuration where the first contact pins 13a each projecting from the upper surface of the upper plate 11a and second contact pins (not shown) each projecting from the bottom surface of the lower plate 11b are respectively connected to each other with urging members (not shown). For example, each of the first contact pins 13a, and each of the second contact pins, and each of the urging members may be formed integrally to be used. In the state shown in FIG. 2, the urging members urge the optical module 3 and the socket 1 in a direction so that they are separated from the electronic substrate 5.

Each of the urging members is preferably a spring-shaped elastic body having a stroke width which can absorb variations in heights of surfaces of the electrical connection terminals and electronic substrate. A length (a sum of lengths of each of the first contact pins 13a, each of the second contact pins, and each of the urging members) of the electrical connection section 13 is preferably made to be as short as possible in order to improve the transmission characteristic thereof.

Since the electrical connection section 13 has the above configuration, when the socket 1 is pressed from above with a certain pressure or more for example, contact resistances between the electrical connection terminals 51 of the electronic substrate 5 and the second contact pins can be maintained at small values, due to a spring characteristic of the urging member. Similarly, when the optical module 3 housed in the socket 1 is pressed from above with a certain pressure or more, the contact resistances between the electrical connection terminals (not shown) of the optical module 3 and the first contact pins 13a can be maintained at small values.

It is also possible to shorten the line length (for example, 1.2 millimeters or less) of the electrical connection section 13 compared to that (for example, about 3 millimeters to 4 millimeters) of the case of using the MEG-Array connectors.

Thus, the transmission loss and the crosstalk can be reduced, and the characteristics can be improved by the electrical connection section 13 of the socket 1.

In addition, the electrical connection section 13 is preferably placed in an arrangement state (for example, a bilaterally symmetric arrangement) so that a pressing force is uniformly applied on the bottom wall 11 of the socket 1 when the pressing member 2 to be described later presses the optical module 3. In this case, the electrical connection terminals 51 corresponding to the electrical connection section 13 among the electrical connection terminals 51 formed to be the full grid pattern on the electronic substrate 5 are connected to the wiring pattern.

The side wall 12 of the socket 1 includes an aperture section 12a which has substantially the same size as the size of the module substrate 34 of the optical module 3, and a step portion (guiding portion) 12b is formed on the inner wall of the side wall 12. The housing section 14 formed of the bottom wall 11 and the side wall 12 preferably has a shape which agrees with the external shape of the optical module 3. Since the optical module 3 is guided to a housing position of the housing section 14 by the step portion 12b formed on the side wall 12, position adjustment of the optical module 3 becomes easy. When the optical module 3 is placed in the socket 1 and is pressed, the module substrate 34 is pressed against the bottom wall 11, and the case cover 35 is pressed against the step portion 12b.

Thus, the optical module 3 is fitted into the socket 1 to be placed thereon, and thereby the stable fixing state of the optical module 3 can easily be held.

At the four corners of the bottom wall 11 and the side wall 12, screw holes 17 for fixing the pressing member 2 with screws are formed. At positions which are in the vicinities of the screw holes 17 and opposed to the through-holes 52 of the electronic substrate 5, screw holes 15 for fixing the socket 1 to the electronic substrate 5 with screws are formed. At diagonally opposed two corners on the back surface of the bottom wall 11 (the lower plate 11b), locating pins (not shown) to engage with the locating pin holes 53 of the electronic substrate 5 are formed.

The pressing member 2 is a lid-like member to be mounted on the upper surface of the socket 1, and an aperture section 21 is formed at a position opposed to the ferrule 31 of the optical module 3. The aperture section 21 functions as a light extraction portion for guiding a light emitted from the optical module 3 to the outside to extract the light.

At least a contact surface of the pressing member 2 contacting with the optical module 3 is composed of material having a thermal conductivity equal to or more than that of the case cover (housing member) 35 of the optical module 3. For example, Al having electrical conductivity of 238 W/mK, Cu having electrical conductivity of 393 W/mK, and Al—SiC having electrical conductivity of 150 W/mK to 200 W/mK can be used. In addition, Al—SiC has electrical conductivity of 150 W/mK in case of 30Al-70SiC and 200 W/mK in case of 40Al-60SiC. Also a resin material to which thermal conductive filler is mixed and which has electrical conductivity of 0.4 W/mK or more may be used. The heat generated in the optical module 3 can hereby be discharged to the outside efficiently.

The upper surface of the pressing member 2 is formed as a planar portion 22, on which a heat radiating member (heat sink) can be placed. The heat generated in the optical module 3 can hereby be discharged to the outside more efficiently.

In addition, the pressing member 2 itself may be formed as a heat sink by forming the upper surface of the pressing member 2 as a heat radiating structure (for example, a fin structure) in stead of placing the heat sink on the planar portion 22 of the pressing member 2.

In the pressing member 2, an optical connector housing section 24 for housing the ferrule 42 of the optical connector 4 is formed. The optical connector housing section 24 is formed by recessing the upper surface of the pressing member 2 from the aperture section 21 in the arranged direction of the optical fiber ribbon 41 so that the optical connector housing section 24 is lowered by one step from the upper surface. The height (difference in level from the upper surface) of the connector housing section 24 is designed so that the upper surface of the optical connector 4 (the upper surface of the ferrule 42) and the upper surface of the pressing member 2 are substantially on the same level when the optical connector 4 is installed in the optical module 3.

By this, when the optical connector 4 is installed in the optical module 3, the optical connector 4 is prevented from projecting in a vertical direction with respect to the electronic substrate 5, and this is effective for miniaturization of the system apparatus.

At the four corners of the pressing member 2, through-holes 23 for fixing the pressing member 2 to the socket 1 with screws are formed. In addition, the pressing member 2 may be provided with a mechanism (for example, a spring) for fixing the optical connector 4 installed in the optical module 3.

The abovementioned optical module mounting unit 100 (socket 1 and pressing member 2), the optical module 3, and the optical connector 4 are mounted on the electronic substrate 5 as described below.

Figure 5:
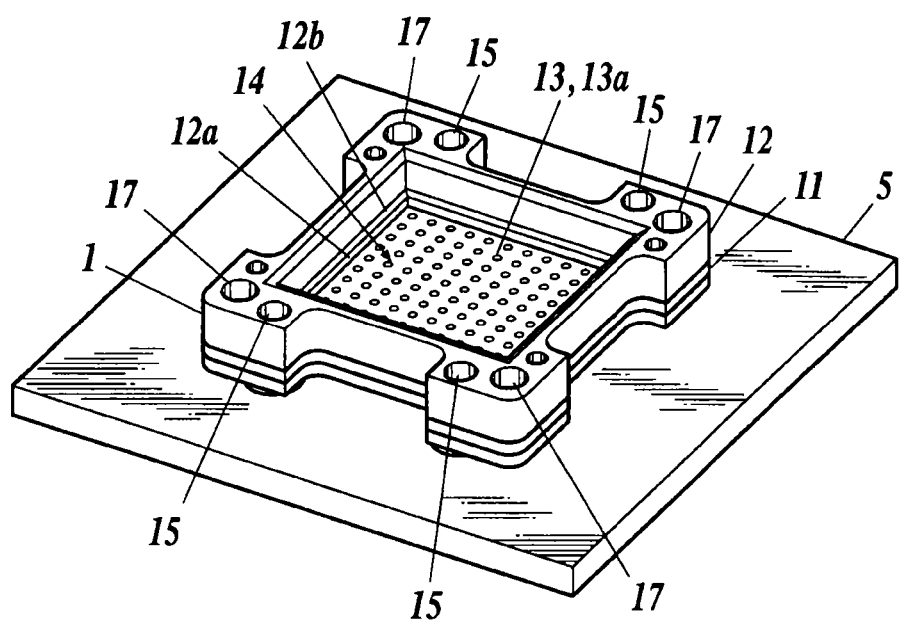
FIG. 5 is an explanatory view of an example of a mounting process of an optical module 3.
Figure 6:
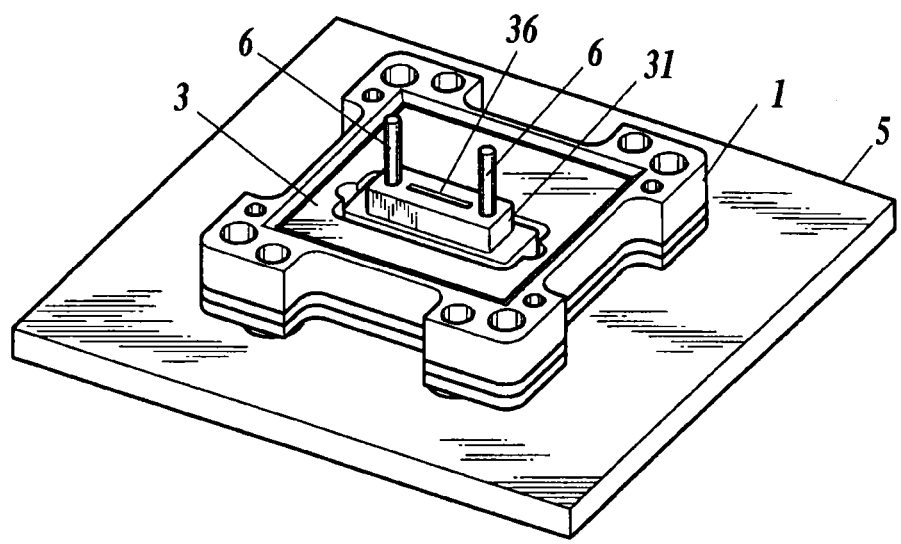
FIG. 6 is an explanatory view of the example of the mounting process of the optical module 3.
Figure 7:
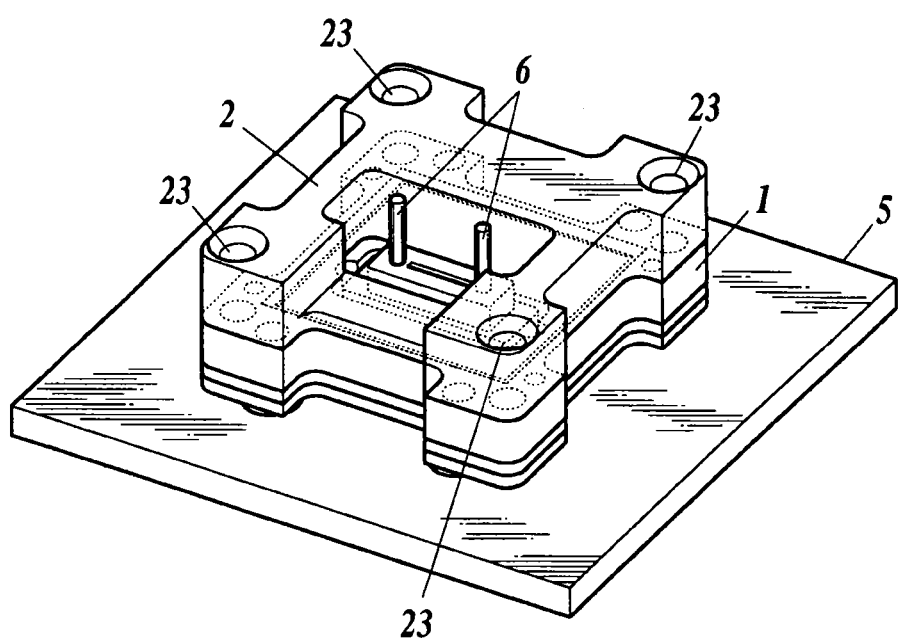
FIG. 7 is an explanatory view of the example of the mounting process of the optical module 3.
Figure 8:
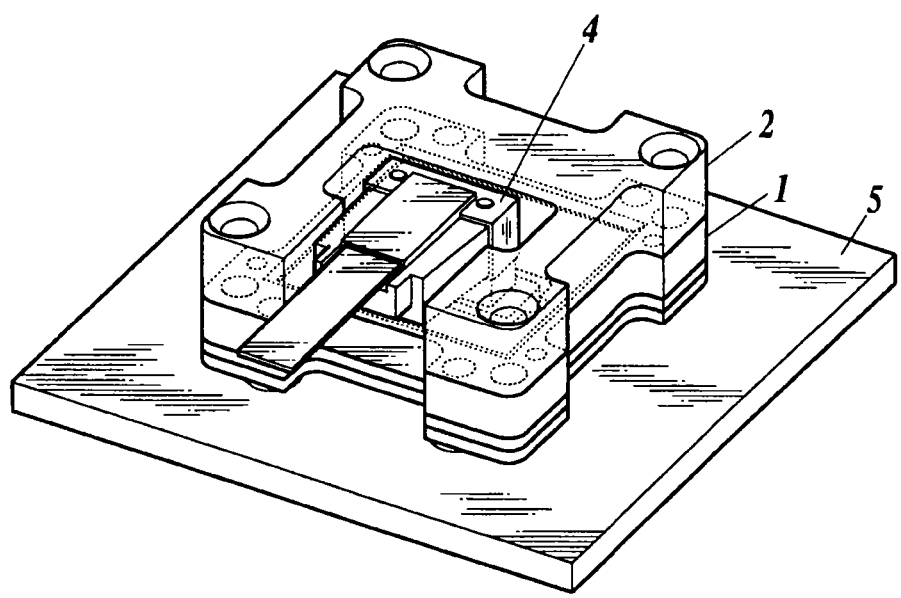
FIG. 8 is an explanatory view of the example of the mounting process of the optical module 3.

FIGS. 5 to 8 are explanatory views of an example of mounting process of the optical module 3. In FIGS. 7 and 8, the pressing member is expressed as a see-through view so that an inner state thereof is visible.

Firstly, as shown in FIG. 5, by respectively engaging the locating pins (not shown) of the socket 1 with the locating pin holes 53 of the electronic substrate 5, the socket 1 is placed at a predetermined position of the electronic substrate 5. Then, by respectively inserting screws into the through-holes 52 from the back surface side of the electronic substrate 5 so that the screws are respectively fastened into the screw holes 15 of the socket 1, the socket 1 is fixed to the electronic substrate 5. In this way, the socket 1 is mounted on the electronic substrate 5 so that the electrical connection terminals 51 of the electronic substrate 5 and the electrical connection section 13 (second contact pins 12) are connected to each other.

In the state shown in FIG. 5, the second contact pins projecting from the bottom surface of the bottom wall 11 of the socket 1 respectively contact with the predetermined electrical connection terminals 51 arranged on the electronic substrate 5, and are pushed into the socket 1 as the urging member shrinks due to the pressing force by screwing.

Next, as shown in FIG. 6, the optical module 3 is placed on the housing section 14 of the socket 1. Since the housing section 14 has the shape which agrees with the external shape of the optical module 3, the lower part of the optical module 3 is placed so as to be substantially fitted into the housing section 14. The guide pins 6, 6 are respectively inserted into the guide pin holes 31a, 31a of the ferrule 31 to be provided to stand.

In the sate shown in FIG. 6, the first contact pins 13a projecting from the upper surface of the bottom wall 11 of the socket 1 respectively contact with the electrical connection terminals (not shown) of the optical module 3.

Next, as shown in FIG. 7, the pressing member 2 is placed on the optical module 3 from the upper side thereof so that the light output end of the ferrule 31 of the optical module 3 is exposed to the outside via the aperture section 21 of the pressing member 2. Then, by inserting screws into the through-holes 23 from the upper side of the pressing member 2 and fastening the screws into the screw holes 17 of the socket 1, the pressing member 2 is fixed to the socket 1.

In the state shown in FIG. 7, the optical module 3 placed on the socket 1 receives the pressing force by screwing to be pressed to the socket 1 side. Moreover, the first contact pins 13a of the socket 1 are pushed thereinto as the urging member shrinks due to the pressing force by screwing.

Thus, the pressing member 2 of the present embodiment functions as a fixing member for holding the state in which the electrical connection terminals (not shown) of the optical module 3 contact with the electrical connection section 13 in the socket 1.

Next, as shown in FIG. 8, by inserting the guide pins 6 provided to stand on the ferrule 31 into the guide pin holes 42a, 42a of the optical connector 4, the optical connector 4 is installed in the optical module 3.

In the state shown in FIG. 8, the optical module 3 and the optical connector 4 are fixed to each other in the state in which their positions are aligned, and the light emitting element 32 of the optical module 3 and the optical fiber ribbon 41 of the optical connector 4 are in the state of being optically coupled to each other. Thus, an emitted light from the optical module 3 propagates in the optical fiber ribbon 41 of the optical connector 4.

As described above, when the optical module 3 is mounted on the electronic substrate 5 by using the optical module mounting unit 100 according to the present embodiment, since the optical module 3 is merely placed on the socket 1 and pressed by the pressing member 2, and the optical module 3 is not fixed by bonding, the optical module 3 is removable from the socket 1 and the electronic substrate 5.

By this, when the optical module is defected or when the optical module is upgraded, only the optical module can be exchanged easily. This is especially useful in the case where a plurality of optical modules is mounted on the same substrate to achieve high density transmission. For example, if bonding defect or failure occurs in one optical module in an electronic substrate on which a plurality of optical modules is mounted with a high density, it is only necessary to remove only defective optical module to exchange it.

When the specification of the electronic substrate is changed, the optical module can be removed and can be reused in another electronic substrate, and thereby the module properties can effectively be used.

Since the number of the mounted optical modules can easily be increased or decreased according to the specification (necessary capacity of transmission) necessary for a user, parts sharing and cost reduction can be improved.

According to the optical module mounting unit 100 of the present embodiment, module properties such as a normal optical module and a normal electronic substrate can effectively be utilized, and thereby an extensive damage due to exchange of whole electronic substrate can be prevented from arising, unlike the prior art.

Since exchanging the optical module is possible, the reliability required for an optical module is allowed to be lower than the present reliability, and thereby the yield ratio of manufacture of the optical modules can be improved and their manufacturing costs can be reduced.

Moreover, in the present embodiment, since also the optical module mounting unit 100 itself is removable from the electronic substrate 5, the property of such part can also be effectively utilized.

The invention made by the present inventors is concretely described based on the embodiment, but the present invention is not limited to the above embodiment, and the present invention can be changed without departing from the subject matter of the invention.

The optical module 3 is fixed by being pressed against the socket 1 with the pressing member 2 in the above embodiment, but the optical module 3 can be fixed by the other fixing member. For example, the optical module 3 may be fixed to the socket 1 with screws, or a spring or the like may directly be provided to the socket 1.

In other words, the subject matter of the present invention is to mount the optical module 3 on the electronic substrate 5 in a removable manner by fixing the optical module 3 to the socket 1 installed on the electronic substrate 5. The method of fixing the optical module 3 to the socket 1 is not limited to any particular one.

In the above embodiment, only one optical module 3 can be placed on the socket 1, but the socket 1 may have a configuration where a plurality of optical modules 3 can be installed thereon at the same time.

Moreover, though after the socket 1 is fixed to the electronic substrate 5, the optical module 3 is placed in the socket 1 to be fixed thereto with the pressing member 2 in the aforesaid embodiment, the optical module 3 may be installed in the optical module mounting unit 100 to be integrated therewith to be mounted on the electronic substrate 5. In other words, as an optical module product to be distributed to markets, the form where the optical module 3 has been mounted on the optical module mounting unit 100 can be supposed.

Furthermore, the pressing member 2 has the form to surround the aperture section 21 so as to press the top surface of the optical module 3 with substantially the whole surface of the pressing member 2, but the pressing member 2 may be formed into a U-shape in a plan view by cutting out the optical connector housing section 24. When the pressing member 2 is formed into such shape, the pressing member 2 can be mounted after mounting the optical connector 4 to the optical module 3.

The electrical connection section 13 can be achieved by another method.

For example, a conductive leaf spring, a member obtained by compressing conductive fibers, or the like can be used. In addition, for example, a member produced by making an electronic substrate including metal films formed on both the surfaces thereof intervene between the upper plate 11a and the lower plate 11b, and by forming a coil spring in the electronic substrate by a photolithographic technique or the like can be used.

In other words, the requirements of the electrical connection section 13 are that a plurality of first contact sections (for example, the tips of the first contact pins 13a) projecting from the upper surface of the bottom wall 11 (the upper plate 11a) and contacting with the electrical connection terminals (not shown) of the optical module 3 are electrically connected to a plurality of second contact sections (for example, the tips of the second contact pins) provided correspondingly to the first contact sections, projecting from the bottom surface of the bottom wall 11 (the lower plate 11b), and contacting with the electrical connection terminals 51 of the electronic substrate 5, and that urging members for urging the optical module 3 and the socket 1 in a direction of separating them from the electronic substrate 5 when the optical module 3 is pressed against the electronic substrate 5 side by the pressing member 2 are respectively provided between the first contact sections and the second contact sections.

It should be considered that all embodiments disclosed herein are illustrations and are not limitations. It is intended that the scope of the present invention is determined by the claims, not the above description, and includes all modifications equivalent to the claims and within the scope thereof.

DESCRIPTION OF REFERENCE NUMERALS 1 socket (module housing body)
11 bottom wall
12 side wall
13 electrical connection section
14 housing section
15 screw hole (for socket fixing)
17 screw hole (for pressing member fixing)
2 pressing member (fixing member)
21 aperture section
22 planar portion
23 through-hole
24 optical connector housing section
3 optical module
31 ferrule (light output end)
32 light emitting element
33 driver IC
34 module substrate
35 case cover
36 optical waveguide
4 optical connector
41 optical waveguide
42 ferrule
43 optical waveguide mounting part
5 electronic substrate
51 electrical connection terminal
52 through-hole
53 locating pin hole
6 guide pin
100 optical module mounting unit

The invention claimed is:

1. An optical module mounting unit for mounting an optical module including an optical element to be optically coupled to an optical waveguide on an electronic substrate, the optical module mounting unit comprising:

a module housing body including an electrical connection section for electrically connecting the electronic substrate and the optical module to each other and a housing section for housing the optical module, the module housing body being mounted on the electronic substrate in such a manner that an electrical connection terminal of the electronic substrate and the electrical connection section are connected to each other; and a fixing member for maintaining a state in which an electrical connection terminal of the optical module has contact with the electrical connection section in the module housing body, wherein the optical module emits a light from an opposite side of the electrical connection section and an optical connector that comprises the optical waveguide and can convert an optical path in a vertical direction is mounted to the optical module, the fixing member is a lid-like pressing member to be mounted on an upper surface of the module housing body and has a role to fix the optical module by pressing a top surface of the optical module to an electronic substrate side, the module housing body is mounted on the electronic substrate in a removable manner and the housing section is a space, formed by a bottom wall and a side wall, whose shape agrees with an external shape of the optical module, the electrical connection terminal of the electronic substrate, which is arranged under the bottom wall, to the electrical connection terminal of the optical module, which is arranged over the bottom wall, through the bottom wall, the electrical connection section is composed of a plurality of first contact sections and a plurality of second contact sections which are electrically connected to each other, the first contact sections projecting from the upper surface of the bottom wall to contact with the electrical connection terminal of the optical module, the second contact sections are provided correspondingly to the first contact sections and projecting from the bottom surface of the bottom wall to contact with the electrical connection terminal of the electronic substrate, the electrical connection section includes an urging member for urging the optical module and the module housing body in a direction of separating the optical module and the module housing body from the electronic substrate when the optical module is pressed to the electronic substrate side by the fixing member, and the urging member is provided between each of the first contact sections and each of the second contact sections, the optical module is housed in the housing section and is fixed in a removable manner by the fixing member, and the optical waveguide and the optical element are configured to be optically coupled to each other in a state in which the optical module is fixed.

2. The optical module mounting unit according to claim 1, wherein the first contact sections and the second contact sections are arranged in such a manner that a pressing force is dispersed uniformly when the optical module is pressed to the electronic substrate side by the pressing member.

3. The optical module mounting unit according to claim 1, wherein the housing section includes a guiding portion for guiding the optical module to a housing position.

4. The optical module mounting unit according to claim 1, wherein the pressing member is composed of material having a thermal conductivity equal to or a higher than that of a housing member of the optical module.

5. The optical module mounting according to claim 1, wherein the pressing member includes a planar portion on which a heat radiating member can be placed.

6. The optical module mounting according to claim 1, wherein a plurality of the optical modules are configured to be installed in the optical module mounting unit.

7. An optical module configured to be installed in the optical module mounting unit according to claim 1.

* * * * *